(12) United States Patent
Chen (10) Patent No.: US 10,463,149 B1
(45) Date of Patent: Nov. 5, 2019

(54) STEEL BALL SLOT LOCKING MECHANISM OF SLIDE RAIL

(71) Applicant: MARTAS PRECISION SLIDE CO., LTD., New Taipei (TW)

(72) Inventor: Wan-Lai Chen, New Taipei (TW)

(73) Assignee: MARTAS PRECISION SLIDE CO., LTD., New Taipei (TW)

( * ) Notice: Subject to any disclaimer, the term of this patent is extended or adjusted under 35 U.S.C. 154(b) by 0 days.

(21) Appl. No.: 16/198,765

(22) Filed: Nov. 22, 2018

(51) Int. Cl.
| F16C 29/04 | (2006.01) |
| F16C 29/10 | (2006.01) |
| A47B 88/473 | (2017.01) |
| A47B 88/493 | (2017.01) |
| A47B 88/95 | (2017.01) |
| A47B 88/483 | (2017.01) |
| H05K 7/14 | (2006.01) |
| A47B 88/467 | (2017.01) |

(52) U.S. Cl.
CPC .......... *A47B 88/473* (2017.01); *A47B 88/483* (2017.01); *A47B 88/493* (2017.01); *F16C 29/04* (2013.01); *F16C 29/10* (2013.01); *A47B 2088/4675* (2017.01); *A47B 2088/955* (2017.01); *A47B 2210/0032* (2013.01); *A47B 2210/0035* (2013.01); *A47B 2210/0081* (2013.01); *H05K 7/1489* (2013.01)

(58) Field of Classification Search
CPC .......... F16C 29/02; F16C 29/04; F16C 29/10; F16C 29/126; H05K 7/1489; A47B 88/467; A47B 88/473; A47B 88/483; A47B 88/493; A47B 2088/955; A47B 2088/4675; A47B 2210/0032; A47B 2210/007; A47B 2210/0004; A47B 2210/0035; A47B 2210/0081
USPC .......... 384/21, 18, 26, 35, 40–41; 312/319.1, 312/333, 334.25, 334.44, 334.46, 334.17, 312/334.33
See application file for complete search history.

(56) References Cited

U.S. PATENT DOCUMENTS

| 5,757,109 A * | 5/1998 | Parvin ................ A47B 88/493 |
| | | 312/334.11 |
| 6,254,205 B1 * | 7/2001 | Wright ................ E05B 65/464 |
| | | 312/217 |

(Continued)

FOREIGN PATENT DOCUMENTS

| JP | 5725219 B1 * | 5/2015 | .......... H05K 7/1489 |
| WO | WO-2012094812 A1 * | 7/2012 | .......... A47B 88/467 |

*Primary Examiner* — Marcus Charles
(74) *Attorney, Agent, or Firm* — Fei-hung Yang (57) ABSTRACT

A steel ball retainer locking mechanism of a slide rail includes an engaging block, a release hole, a locking hook, a synchronized hook and a releasing hook. The slide rail includes an outer rail, a steel ball retainer and an inner rail, and the engaging block has a synchronized engaging block and a locking block separated with an interval apart from each other, and the synchronized engaging block has a releasing portion and a synchronized hook portion corresponding to the outer rail and the inner rail respectively, and the locking block has a locking portion and a propping portion corresponding to the outer rail and the inner rail respectively. When the inner rail is pulled outward, the engaging block is locked by the locking hook. After the releasing hook pushes the propping portion, the engaging block is unlocked.

6 Claims, 8 Drawing Sheets

(56) References Cited

U.S. PATENT DOCUMENTS

| | | | |
|---|---|---|---|
| 6,454,372 B1* | 9/2002 | Yang | A47B 88/493 312/334.13 |
| 6,497,464 B1* | 12/2002 | Cammack | A47B 88/467 312/333 |
| 7,108,340 B2* | 9/2006 | Lai | A47B 88/57 312/333 |
| 7,458,651 B1* | 12/2008 | Radke | A47B 88/467 312/333 |
| 7,520,577 B2* | 4/2009 | Chen | A47B 88/493 312/333 |
| 7,708,357 B2* | 5/2010 | Cho | A47B 88/53 312/333 |
| 8,434,836 B2* | 5/2013 | Holcomb | A47B 88/483 312/334.1 |
| 2007/0170829 A1* | 7/2007 | Chen | A47B 88/467 312/334.1 |
| 2008/0231156 A1* | 9/2008 | Hoshide | A47B 88/467 312/334.46 |
| 2013/0058598 A1* | 3/2013 | Chang | F16C 29/005 384/41 |
| 2018/0306236 A1* | 10/2018 | Liu | F16C 17/10 |

* cited by examiner

STEEL BALL SLOT LOCKING MECHANISM OF SLIDE RAIL

FIELD OF INVENTION

The present invention relates to the field of industrial computer cabinets, in particular to a steel ball retainer locking mechanism of a slide rail that can be installed quickly and provided for sliding the slide rail smoothly in different using conditions.

BACKGROUND OF INVENTION

Description of the Related Art

In general, furniture such as a desk, a cupboard or an industrial computer cabinet is divided into two main parts: a moving part and a fixed part. The moving part can be moved with respect to the fixed part to achieve the effects of storing or using an object. To achieve a smooth operation of the moving part, a slide rail is often used, and the slide rail may be divided into a two-stage slide rail, a three-stage slide rail, etc. according to the stretchable length of the slide rail. Wherein, the two-stage slide rail is formed by an outer rail, a steel ball retainer, and an inner rail, and the outer rail is mounted onto the fixed part, and the inner rail is mounted onto the moving part, and the steel ball retainer is connected between the outer rail and the inner rail through a ball bearing, so that the inner rail can be pushed or pulled back and forth in a direction same as the axial direction of the outer rail by means of a slip effect of the steel ball retainer, and the moving part can be pulled or retracted relative to the fixed part.

To pull the inner rail all the way out to a fully exposed position and maintain such position while using the slide rail to achieve the best smoothness and stability of the movement, a link mechanism known as a slide rail synchronization mechanism is usually installed to the slide rail. When the inner rail is pulled out completely to a fully exposed position (particularly when the inner rail is positioned at a stretch limit position), the slide rail synchronization mechanism may be coupled to the steel ball retainer and the inner rail to prevent the two from separating from one another or forming a gap which may cause the moving part to shake easily. When the inner rail is retracted, the steel ball retainer and the inner rail are retracted synchronously to reduce the load and stress exerted onto the slide rail to achieve the effect of extending the service life of the slide rail. When the steel ball retainer cannot be coupled to the outer rail during use, the inner rail and the steel ball retainer may be dislocated easily before restoring the position. As a result, the inner rail and/or the steel ball retainer may be damaged by large torques. Therefore, it is a main subject for manufacturers or designers of the related industry to provide an innovative slide rail with a smoothly coordinated movement between the inner rail, the steel ball retainer and the outer rail.

In view of the drawbacks of the traditional slide rails, the inventor of the present invention based on years of experience to conduct extensive research and experiment, and finally developed a steel ball retainer locking mechanism of a slide rail and designed an engaging block disposed on the steel ball retainer together with the corresponding locking and the synchronization of the inner rail and the outer rail to achieve the effects of locking the steel ball retainer easily when the slide rail is pulled or pushed, providing excellent slip and support effects, improving the smoothness of the operation, and extending the service life of the slide rail.

SUMMARY OF THE INVENTION

Therefore, it is a primary objective of the present invention to provide a steel ball retainer locking mechanism of a slide rail, and the steel ball retainer has an engaging block provided for locking an inner rail with an outer rail of the slide rail, such that the inner rail can slide more smoothly to extend the service life effectively.

To achieve the aforementioned and other objectives, the present invention provides a steel ball retainer locking mechanism of a slide rail, wherein the slide rail comprises an outer rail, a steel ball retainer, and an inner rail, and the outer rail is fixed, and the inner rail is movable, and the direction of pulling the inner rail outward with respect to the outer rail is defined as a positive direction, and the direction of pulling the inner rail inward with respect to the outer rail is defined as a negative direction. The steel ball retainer locking mechanism comprises an engaging block installed at the center of the steel ball retainer and further comprises a synchronized engaging block and a locking block separated with an interval apart from each other, a releasing portion extended outwardly from a side corresponding to the outer rail, a synchronized hook portion extended outwardly from a side corresponding to the inner rail, a locking portion disposed on a side corresponding to the locking block, a propping portion disposed on a side corresponding to the inner rail; a release hole formed on a side of the outer rail facing the steel ball retainer, configured to be corresponsive to the releasing portion, and the releasing portion being latched into the release hole and capable of releasing the synchronization of the steel ball retainer and the inner rail; a locking hook, formed on a side of the outer rail facing the steel ball retainer, and configured to be corresponsive to the locking portion, so that the release hole and the locking hook are separated with an interval apart from each other, and capable of locking the steel ball retainer and the outer rail after the locking hook and the locking portion are latched with each other; a synchronized hook, formed on a side of the inner rail facing the steel ball retainer, and configured to be corresponsive to the synchronized hook portion, and capable of synchronizing the steel ball retainer and the inner rail after the synchronized hook portion is latched to the synchronized hook; and a releasing hook, formed on a side of the inner rail facing the steel ball retainer, and configured to be corresponsive to the propping portion, and capable of unlocking the steel ball retainer and the outer rail; thereby, when the inner rail is pulled outwardly to a predetermined position, the engaging block is abutted by the locking hook, so that the steel ball retainer is maintained at the position to define a locked condition. After the releasing hook pushes the propping portion, the lock is released. When the inner rail is pulled outwardly, the steel ball retainer is unsynchronized, and when the inner rail is pulled continuously outward, the synchronized hook portion is latched to the synchronized hook again to define a compulsory restoration. As a result, the steel ball retainer can restore its original predetermined position to prevent the inner rail from falling out during use.

In an exemplary embodiment, the steel ball retainer has a mounting hole formed at the center thereof, and the engaging block has a mounting portion configured to be corresponsive to the mounting hole, and the mounting portion has two latches latched and fixed into the mounting hole to improve the convenience of installation significantly. In addition, the mounting portion further has a first elastic arm and a second elastic arm extending in the same direction, and the first elastic arm and the second elastic arm are separated with an interval apart from each other, and the synchronized engaging block is disposed at an end of the first elastic arm, and the locking block is disposed at an end of the second elastic arm, and the steel ball retainer has a through hole configured to be corresponsive to the synchronized engaging block and the locking block, so that the synchronized hook portion and the propping portion can be passed out from the through hole. By the restoring elasticity of the two elastic arms, the synchronized engaging block and the locking block can swing towards the inner rail and the outer rail reciprocally and respectively.

In addition, the releasing hook of the present invention has a first guiding slope formed separately in the positive direction and the negative direction of moving the inner rail, and the propping portion has a second guiding slope corresponding to the two first guiding slopes separately, and the first guiding slopes and the second guiding slopes are abutted against each other, so that the locking block can swing along the vertical direction of installing the slide rail by the elasticity of the second elastic arm in order to lock or unlock the steel ball retainer with respect to the outer rail. In addition, the synchronized hook has a convex portion disposed on a side facing the positive direction of moving the inner rail, and when the releasing portion abuts the convex portion, the synchronized hook swings along the horizontal direction of installing the slide rail by the elasticity of the first elastic arm, so that the steel ball retainer can be synchronized or unsynchronized with respect to the inner rail.

DESCRIPTION OF THE PREFERRED EMBODIMENTS

To make it easier for our examiner to understand the objective, technical characteristics, structure, innovative features, and performance of the invention, we use preferred embodiments together with the attached drawings for the detailed description of the invention. It is noteworthy that the embodiments are provided for the purpose of illustrating the invention but not intended for limiting the scope of the invention.

With reference to FIGS. 1, 2, 3 and 4 to 6 for exploded views of a preferred embodiment of the present invention viewing at different viewing angles, a schematic view of an engaging block, and schematic views showing different statuses of a normal operation in accordance with the present invention respectively, the present invention provides a steel ball retainer locking mechanism 2 of a slide rail 1, wherein the slide rail 1 comprises an outer rail 11, a steel ball retainer 12 and an inner rail 13, and the outer rail 11 is fixed, and the inner rail 13 is movable, and the direction for the inner rail 13 to be pulled outwardly with respect to the outer rail 11 is defined as a positive direction, and the direction for the inner rail 13 to be pushed inwardly with respect to the outer rail 11 is defined as a negative direction. The steel ball retainer locking mechanism 2 comprises an engaging block 21, a release hole 22, a locking hook 23, a synchronized hook 24 and a releasing hook 25, wherein the steel ball retainer 12 has a mounting hole 121 and a through hole 122 formed at the center of the steel ball retainer 12.

Figure 1:
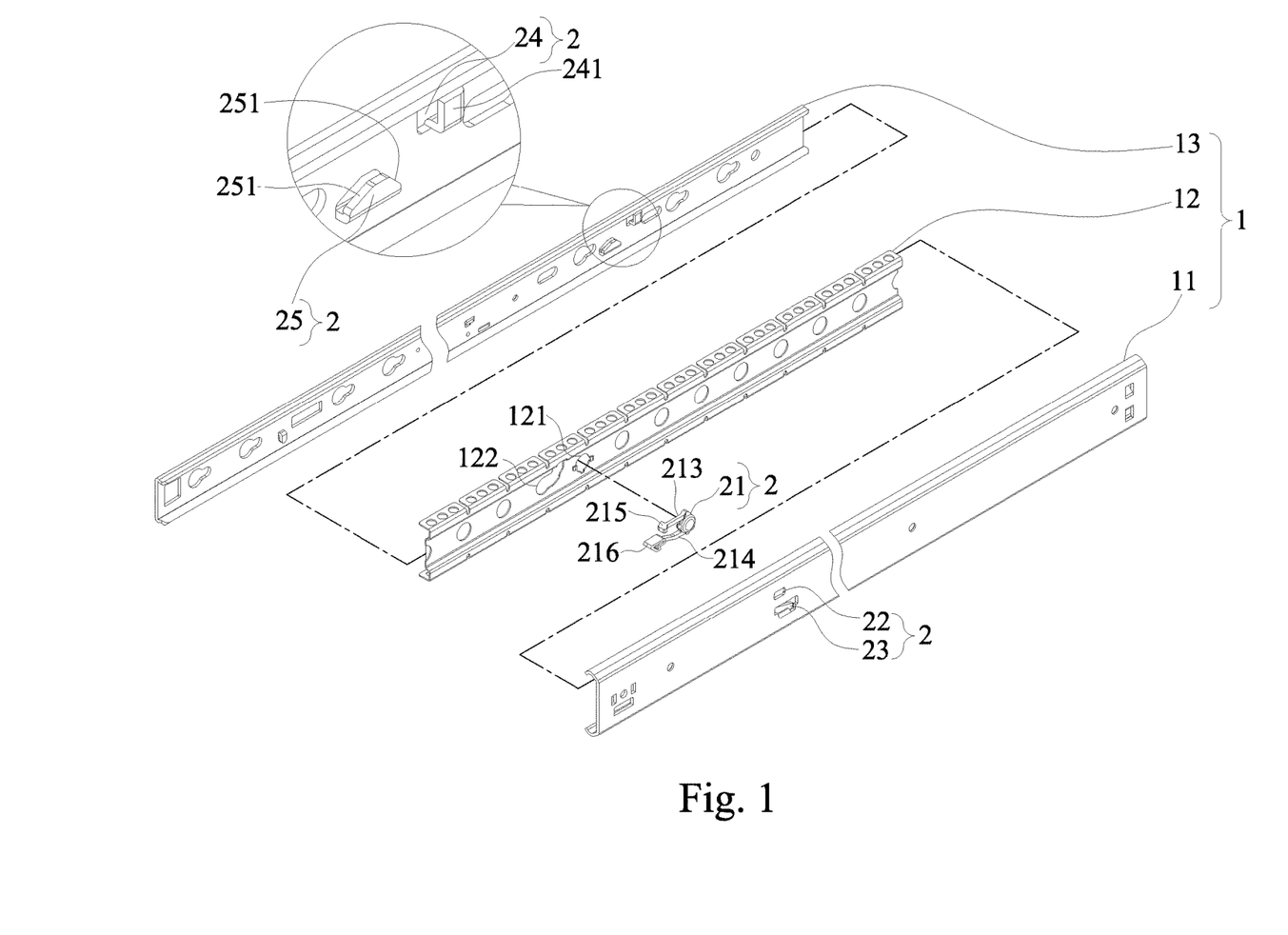
FIG. 1 is an exploded view of a preferred embodiment of the present invention viewing from a first viewing angle.
Figure 2:
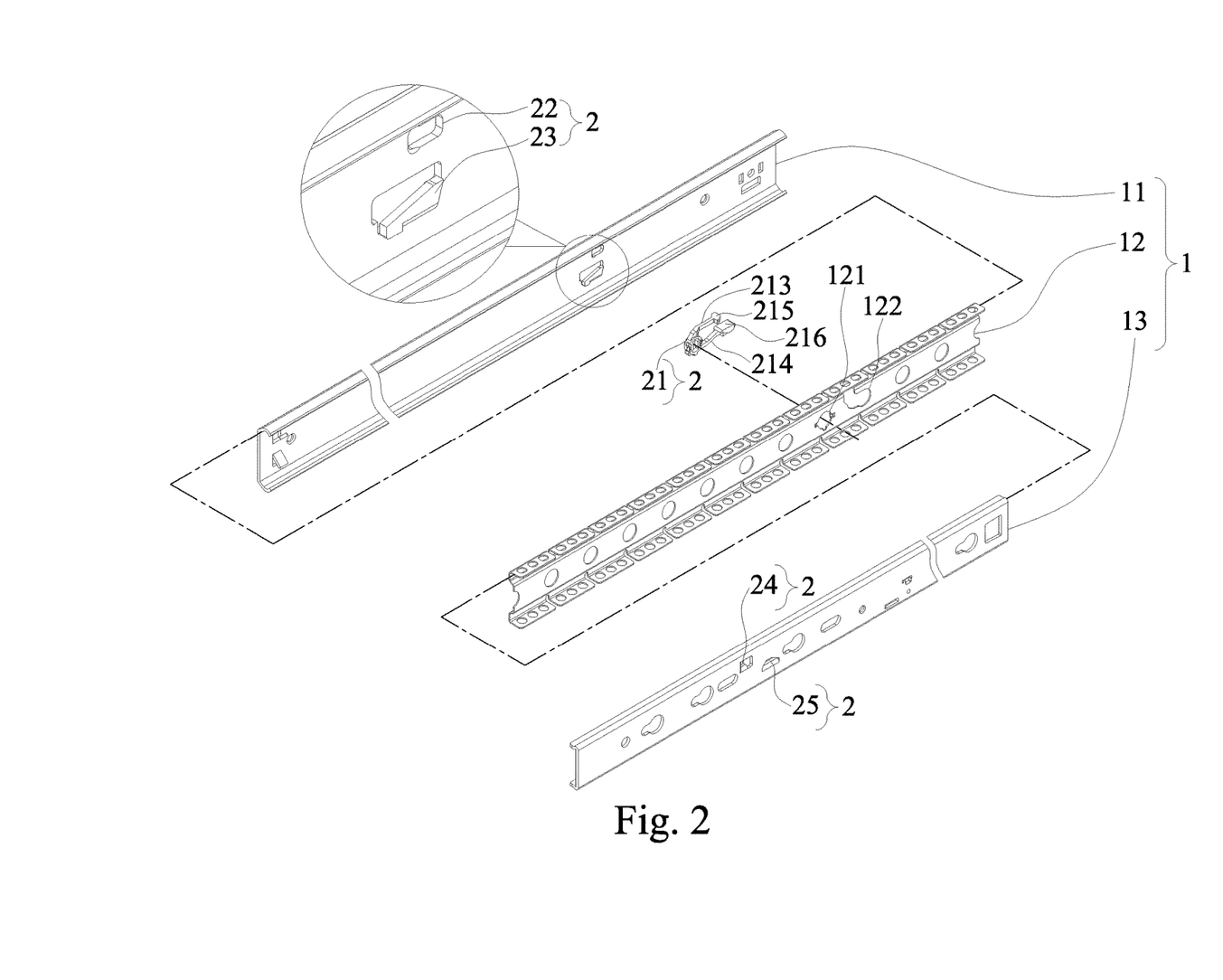
FIG. 2 is an exploded view of a preferred embodiment of the present invention viewing from a second viewing angle.
Figure 3:
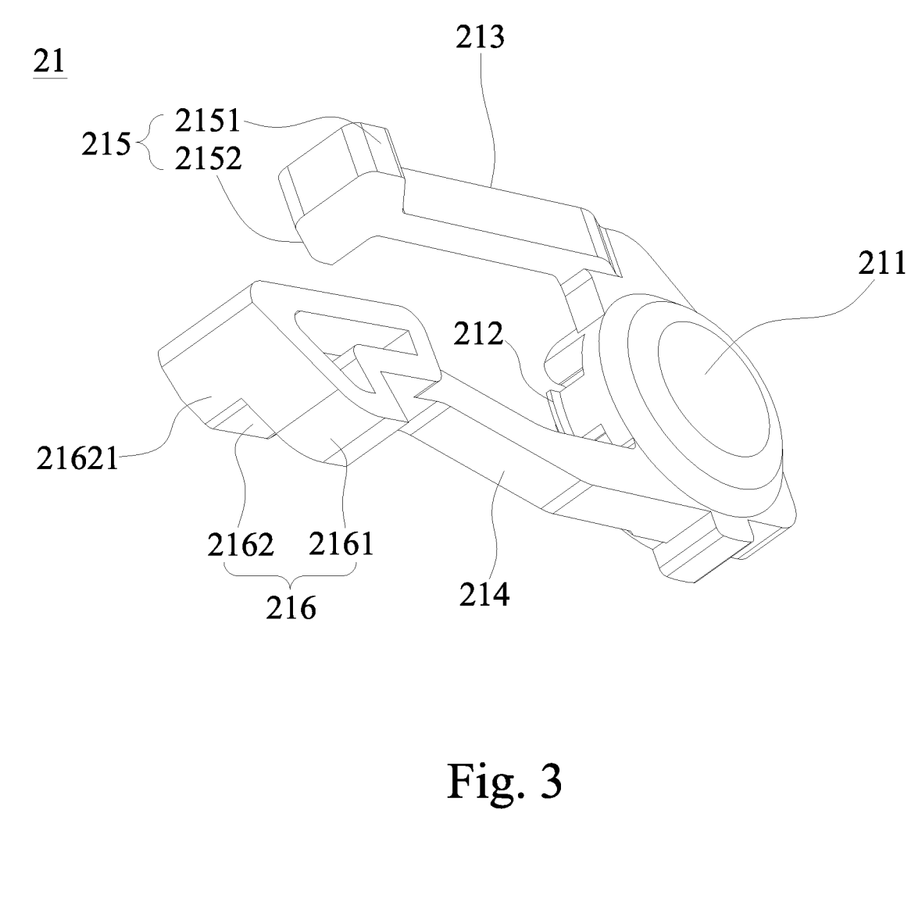
FIG. 3 is a schematic view of an engaging block in accordance with a preferred embodiment of the present invention.

Wherein, the engaging block 21 has a mounting portion 211 configured to be corresponsive to the mounting hole 121, and the mounting portion 211 has two latches 212 latched and fixed into the mounting hole 121 at the center of the steel ball retainer 12. Since the mounting portion 211 has a first elastic arm 213 and a second elastic arm 214 extending in the same direction, and the first elastic arm 213 and the second elastic arm 214 are separated with an interval apart from each other, and an end of the first elastic arm 213 has a synchronized engaging block 215, and an end of the second elastic arm 214 has a locking block 216, and the synchronized engaging block 215 has a releasing portion 2151 extended outwardly from a side corresponding to the outer rail 11 and a synchronized hook portion 2152 extended outwardly from a side corresponding to the inner rail 13, and the locking block 216 has a locking portion 2161 disposed on a side corresponding to the outer rail 11 and a propping portion 2162 disposed on a side corresponding to the inner rail 13, therefore the synchronized hook portion 2152 and the propping portion 2162 can pass through the through hole 122.

The release hole 22 is formed on a side of the outer rail 11 facing the steel ball retainer 12, and the release hole 22 is formed at a position corresponding to the releasing portion 2151, and the releasing portion 2151 is latched into the release hole 22, so that the steel ball retainer 12 and the inner rail 13 can be unsynchronized.

The locking hook 23 is formed on a side of the outer rail 11 facing the steel ball retainer 12, and the locking hook 23 is disposed at a position corresponding to the locking portion 2161, so that the release hole 22 and the locking hook 23 can be separated from each other. After the locking hook 23 and the locking portion 2161 are latched to each other, the steel ball retainer 12 and the outer rail 11 are locked. When the inner rail 13 is pulled outwardly, the steel ball retainer 12 still maintains its original position.

The synchronized hook 24 is formed on a side of the inner rail 13 facing the steel ball retainer 12, and the synchronized hook 24 is installed at a position corresponding to the synchronized hook portion 2152. After the synchronized hook portion 2152 is latched to the synchronized hook 24, the steel ball retainer 12 and the inner rail 13 are synchronized. When the inner rail 13 is pulled outwardly, the steel ball retainer 12 is pulled outwardly and synchronously. It is noteworthy that the synchronized hook 24 has a convex portion 241 disposed on a side relative to the position direction of which the inner rail 13 is moved. When the releasing portion 2151 abuts against the convex portion 241, the synchronized hook 24 uses the elasticity of the first elastic arm 213 to swing in a horizontal direction along the installed slide rail 1, so that the steel ball retainer 12 can be synchronized or unsynchronized with respect to the inner rail 13.

The releasing hook 25 is formed on a side of the inner rail 13 facing the steel ball retainer 12, and the releasing hook 25 is installed at a position corresponding to the propping portion 2162, so that the steel ball retainer 12 and the outer rail 11 can be unlocked. When the inner rail 13 is pulled outwardly, the steel ball retainer 12 will be detached from the original locked position and can be moved. It is noteworthy that the releasing hook 25 has a first guiding slope 251 separately formed in the positive direction and negative direction of moving the inner rail 13, so that the releasing hook is substantially a trapezoidal structure (viewing from a side), and the propping portion 2162 has a second guiding slope 21621 corresponding to the two first guiding slopes 251 separately. When the first guiding slopes 251 and the second guiding slopes 21621 abut against one another, the locking block 216 can swing along the vertical direction of installing the slide rail 1 by the elasticity of the second elastic arm 214, so that the steel ball retainer 12 and the outer rail 11 can be locked or unlocked.

Figure 4:
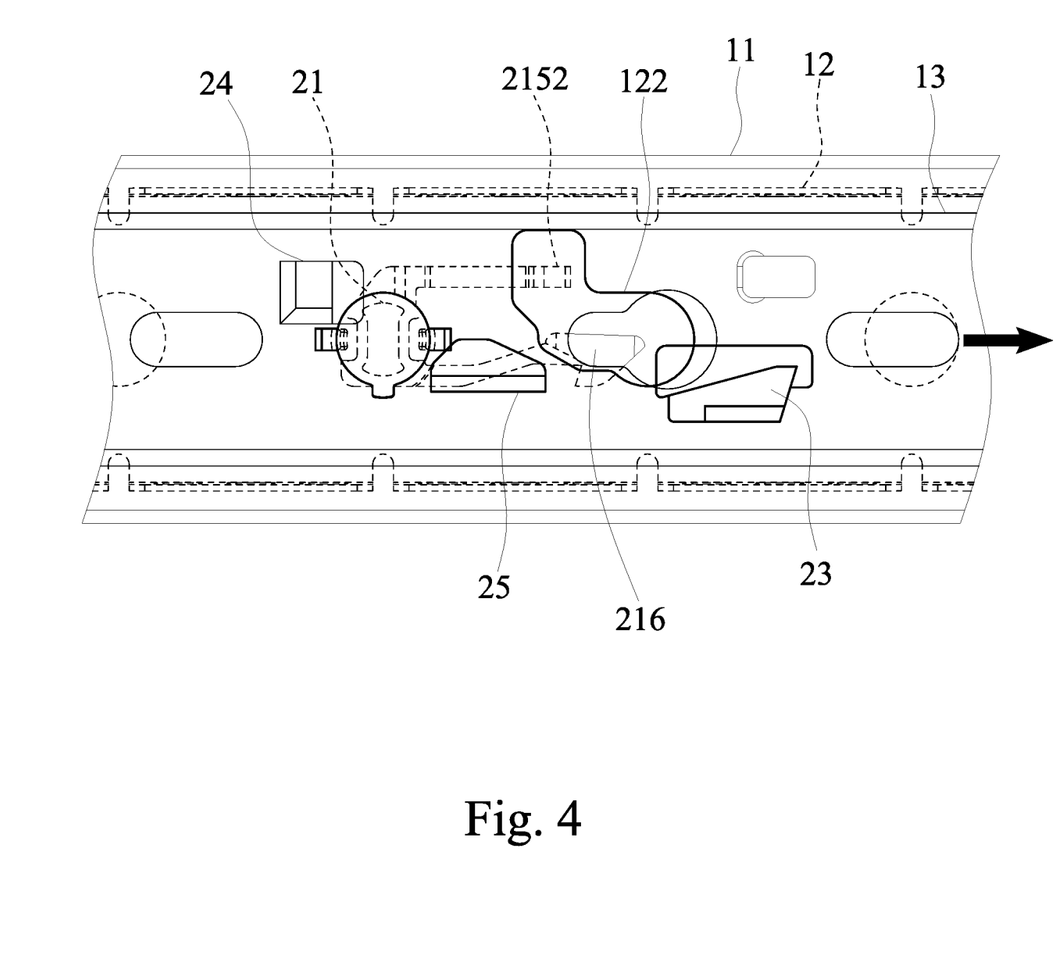
FIG. 4 is a first schematic view showing the status of a normal operation in accordance with a preferred embodiment of the present invention.
Figure 5:
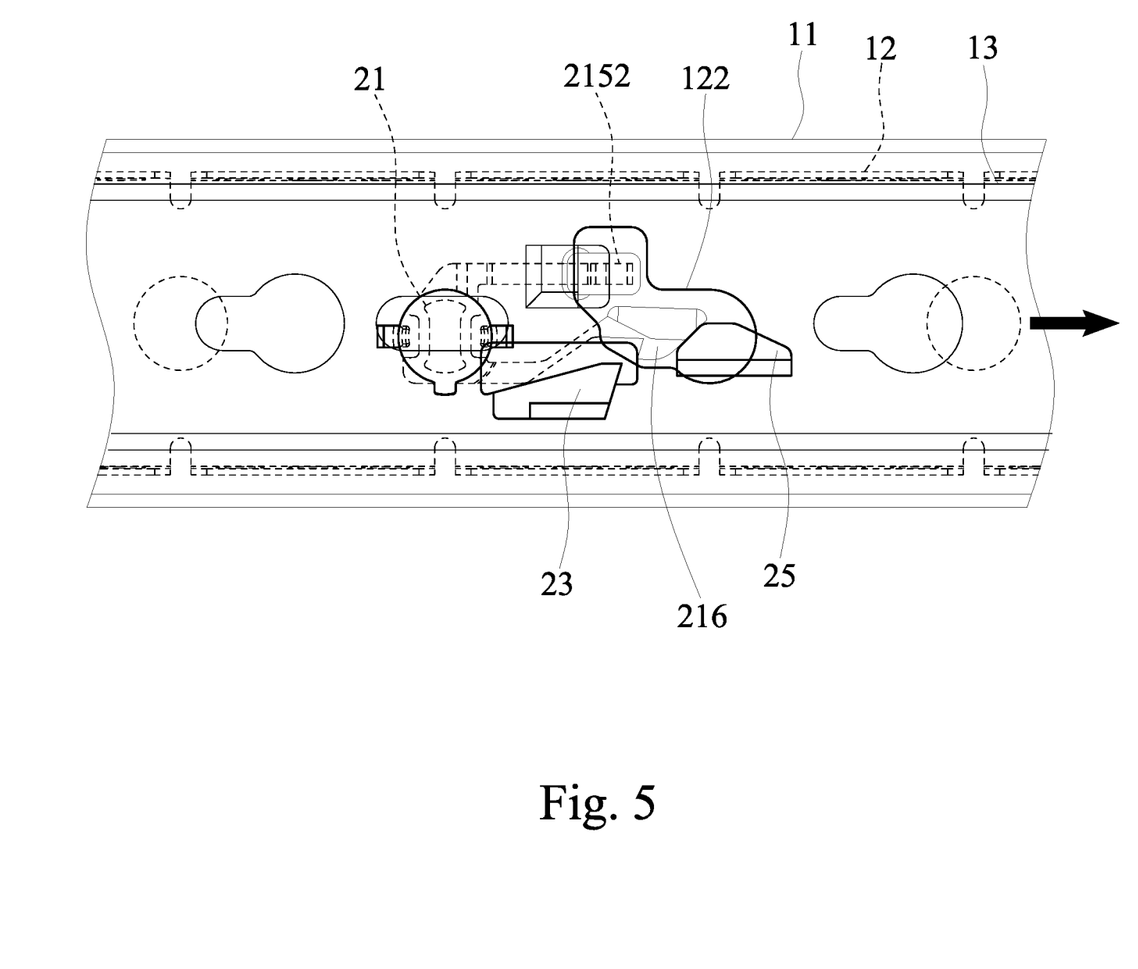
FIG. 5 is a second schematic view showing the status of a normal operation in accordance with a preferred embodiment of the present invention.
Figure 6:
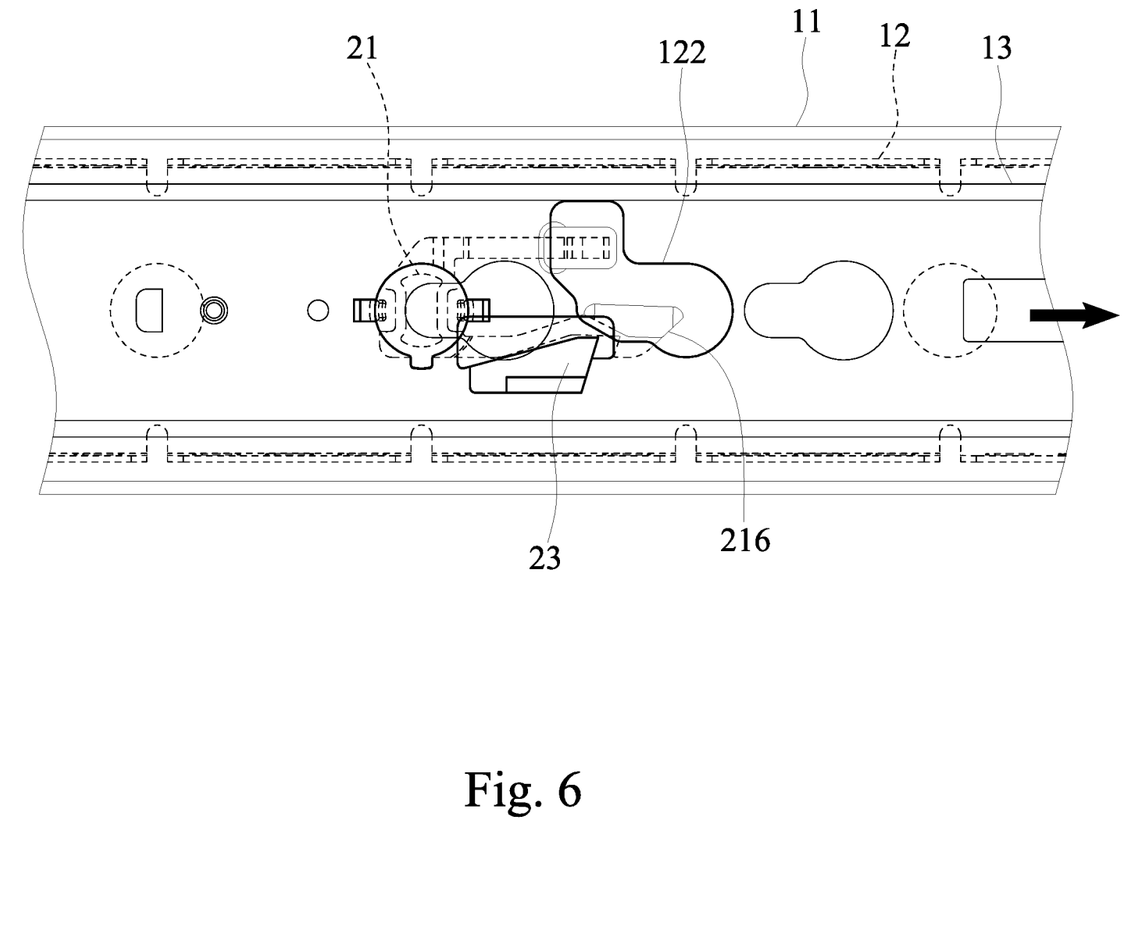
FIG. 6 is a third schematic view showing the status of a normal operation in accordance with a preferred embodiment of the present invention.

When the inner rail 13 is pulled outwardly to a predetermined position, the engaging block 21 is abutted by the locking hook 23, so that the steel ball retainer 12 is maintained at the locked position. After the steel ball retainer 12 is moved to a predetermined position, while the synchronized hook portion 2152 is being latched into the synchronized hook 24, the steel ball retainer 12 can be pulled outwardly and synchronously with the inner rail 13.

Figure 7:
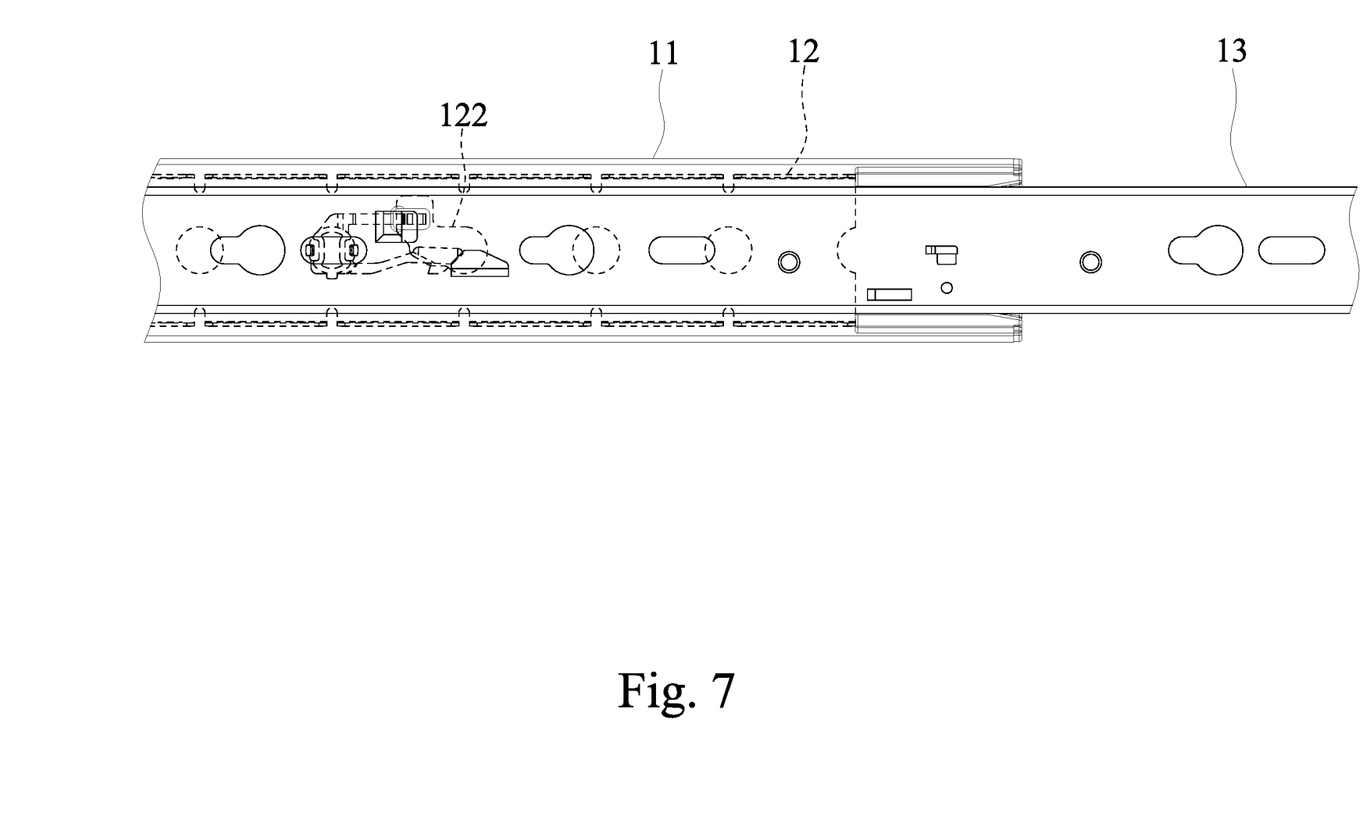
FIG. 7 is a first schematic view showing a restoration in an unsynchronized situation in accordance with a preferred embodiment of the present invention.
Figure 8:
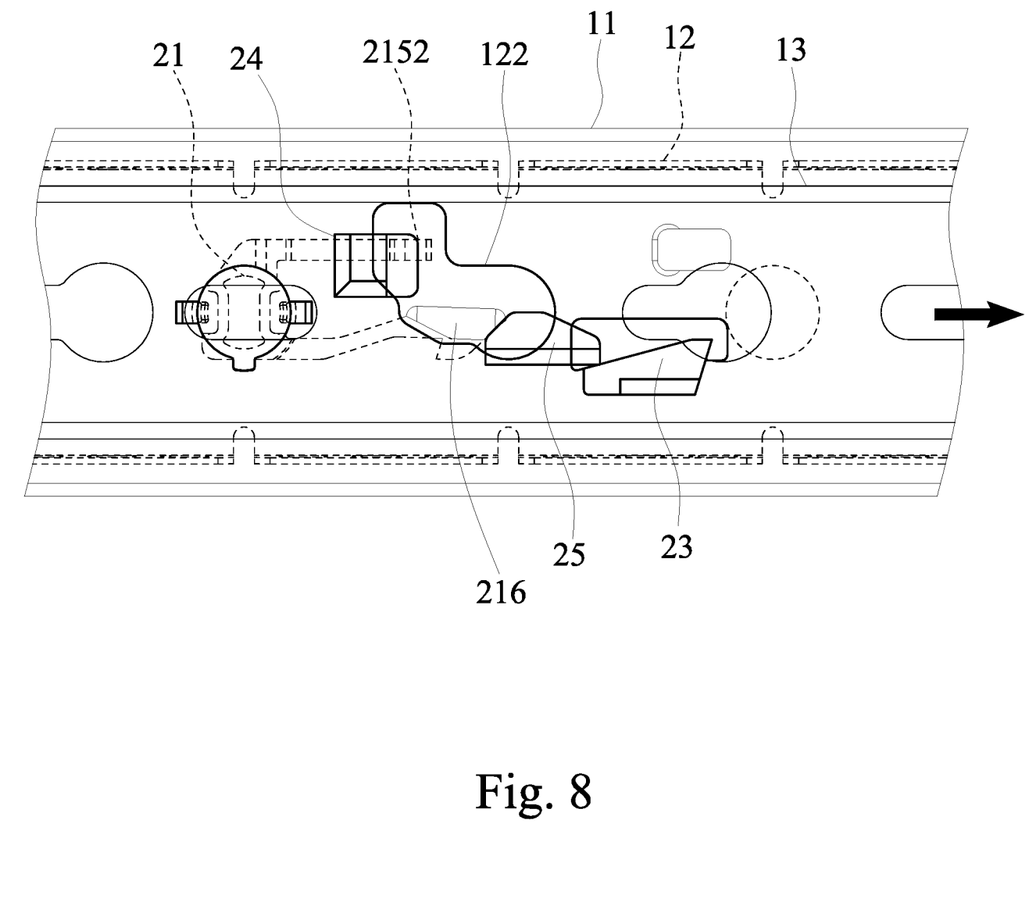
FIG. 8 is a second schematic view showing a restoration in an unsynchronized situation in accordance with a preferred embodiment of the present invention.

With reference to FIGS. 7 and 8 for the schematic views showing different restorations during unsynchronization in accordance with a preferred embodiment of the present invention, when the inner rail 13 is pulled outwardly, and the steel ball retainer 12 is unsynchronized, the inner rail 13 is pulled out, but the steel ball retainer 12 has not reached the original predetermined position, and when the inner rail 13 is pulled continuously, the synchronized hook portion 2152 is latched into the synchronized hook 24 again to define a compulsory restoration, so that the steel ball retainer 12 can restore its original predetermined position to achieve the effect of preventing the inner rail 13 from falling out during use.

What is claimed is:

1. A steel ball retainer locking mechanism of a slide rail, characterized in that the slide rail comprises an outer rail, a steel ball retainer, and an inner rail, and the outer rail is fixed, and the inner rail is movable, and a direction for pulling the inner rail outward with respect to the outer rail is defined as a positive direction, and a direction for pushing the inner rail inward with respect to the outer rail is defined as a negative direction, and the steel ball retainer locking mechanism comprises:

an engaging block, installed at a center of the steel ball retainer, and further comprising a synchronized engaging block and a locking block separated with an interval apart from each other, wherein the synchronized engaging block comprises a releasing portion extending outwardly from a side corresponding to the outer rail, and a synchronized hook portion extending outwardly from a side corresponding to the inner rail, wherein the locking block comprises a locking portion on a side corresponding to the outer rail, and a propping portion on a side corresponding to the inner rail;

a release hole, formed on a side of the outer rail facing the steel ball retainer, configured to be corresponsive to the releasing portion, and the releasing portion being latched into the release hole and capable of unsynchronizing the steel ball retainer and the inner rail;

a locking hook, formed on a side of the outer rail facing the steel ball retainer, and configured to be corresponsive to the locking portion, such that the release hole and the locking hook are separated with an interval apart from each other, wherein the locking hook and the locking portion is capable of locking the steel ball retainer and the outer rail after the locking hook and the locking portion are latched with each other;

a synchronized hook, formed on a side of the inner rail facing the steel ball retainer, and configured to be corresponsive to the synchronized hook portion, wherein the steel ball retainer and the inner rail are synchronized after the hook portion is latched to the synchronized hook; and a releasing hook, formed on a side of the inner rail facing the steel ball retainer, and configured to be corresponsive to the propping portion for unlocking the steel ball retainer and the outer rail;

when the inner rail is pulled outwardly to a predetermined position, the engaging block is abutted by the locking hook, so that the steel ball retainer is maintained at its position and locked, and after the releasing hook pushes the propping portion, a lock is released, and when the inner rail is pulled outwardly, the steel ball retainer is not synchronized, and when the inner rail is pulled outward continuously, the synchronized hook portion is latched to the synchronized hook again to define a compulsory restoration, so that the steel ball retainer restores its original predetermined position to prevent the inner rail from falling out during use.

2. The steel ball retainer locking mechanism of a slide rail according to claim 1, wherein the steel ball retainer has a mounting hole formed at a center thereof, and the engaging block has a mounting portion configured to be corresponsive to the mounting hole, and the mounting portion has two latches latched and fixed into the mounting hole.

3. The steel ball retainer locking mechanism of a slide rail according to claim 2, wherein the mounting portion further has a first elastic arm and a second elastic arm extending in a same direction, and the first elastic arm and the second elastic arm are separated with an interval apart from each other, and the synchronized engaging block is disposed at an end of the first elastic arm, and the locking block is disposed at an end of the second elastic arm.

4. The steel ball retainer locking mechanism of a slide rail according to claim 3, wherein the steel ball retainer has a through hole configured to be corresponsive to the synchronized engaging block and the locking block, so that the synchronized hook portion and the propping portion can pass through the through hole.

5. The steel ball retainer locking mechanism of a slide rail according to claim 4, wherein the releasing hook has a first guiding slope formed separately in the positive direction and the negative direction of the inner rail, and the propping portion has a second guiding slope corresponding to the two first guiding slopes separately, and the first guiding slopes and the second guiding slopes abut against each other, so that the locking block can swing along a vertical direction for installing the slide rail by the elasticity of the second elastic arm in order to lock or unlock the steel ball retainer with respect to the outer rail.

6. The steel ball retainer locking mechanism of a slide rail according to claim 4, wherein the synchronized hook has a convex portion disposed on a side facing the positive direction of moving the inner rail, and when the releasing portion abuts the convex portion, the synchronized hook swings along a horizontal direction of installing the slide rail by elasticity of the first elastic arm, so that the steel ball retainer can be synchronized or unsynchronized with respect to the inner rail.

* * * * *